United States Patent
Tao et al.

(10) Patent No.: US 10,593,416 B2
(45) Date of Patent: Mar. 17, 2020

(54) SHIFT REGISTER, DRIVING METHOD, GATE DRIVING CIRCUIT AND DISPLAY DEVICE

(71) Applicants: BOE Technology Group Co., Ltd., Beijing (CN); Hefei BOE Optoelectronics Technology Co., Ltd., Hefei (CN)

(72) Inventors: Jian Tao, Beijing (CN); Zhifu Dong, Beijing (CN); Hongmin Li, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 0 days.

(21) Appl. No.: 16/168,898

(22) Filed: Oct. 24, 2018

(65) Prior Publication Data
US 2019/0206504 A1    Jul. 4, 2019

(30) Foreign Application Priority Data

Jan. 2, 2018  (CN) .......................... 2018 1 0002629

(51) Int. Cl.
*G09G 3/20* (2006.01)
*G11C 19/28* (2006.01)
(Continued)

(52) U.S. Cl.
CPC ............. *G11C 19/287* (2013.01); *G09G 3/20* (2013.01); *G09G 3/3266* (2013.01);
(Continued)

(58) Field of Classification Search
CPC ............... G09G 3/3266; G09G 3/3674; G09G 2300/0426; G09G 2310/0286; G09G 2310/08; G11C 19/28; G11C 19/287
See application file for complete search history.

(56) References Cited

U.S. PATENT DOCUMENTS

| 10,236,073 B2 * | 3/2019 | Feng .................... G09G 3/3677 |
| 2008/0001904 A1 * | 1/2008 | Kim ..................... G09G 3/3677 |
| | | 345/100 |

(Continued)

FOREIGN PATENT DOCUMENTS

| CN | 103236272 A | 8/2013 |
| CN | 104269132 A | 1/2015 |

(Continued)

OTHER PUBLICATIONS

First office action of Chinese application No. 201810002629.8 dated Nov. 26, 2019.

*Primary Examiner* — Joe H Cheng
(74) *Attorney, Agent, or Firm* — Fay Sharpe LLP

(57) ABSTRACT

A shift register, a driving method, a gate driving circuit and a display device are provided. The shift register includes: a reset circuit, a latch circuit, an output control circuit, and an output circuit which are series connected in sequence. The reset circuit is configured to provide an input signal from the input signal end for the pull-up node under the control of a reset signal from the reset signal end; the latch circuit is respectively connected to the input signal end and the pull-up node, and is configured to control the potential of the pull-up node; the output control circuit is respectively connected to the pull-up node, a dock signal end, and a control node, and is configured to control the potential of the control node; and the output circuit is respectively connected to the control node and an output end, and is configured to control the potential of the output end. The shift register reduces the (Continued)

layout area occupied by the gate driving circuit and can effectively save power consumption and improve the anti-interference ability of the signal.

20 Claims, 9 Drawing Sheets

(51) Int. Cl.
G09G 3/3266 (2016.01)
G09G 3/36 (2006.01)
(52) U.S. Cl.
CPC ... *G09G 3/3674* (2013.01); *G09G 2300/0426* (2013.01); *G09G 2310/0286* (2013.01); *G09G 2310/08* (2013.01)

(56) References Cited

U.S. PATENT DOCUMENTS

| | | | |
|---|---|---|---|
| 2015/0179277 A1* | 6/2015 | Pai | G09G 3/20 377/68 |
| 2015/0228354 A1 | 8/2015 | Qing et al. | |
| 2015/0317954 A1 | 11/2015 | Jang | |
| 2016/0351112 A1 | 12/2016 | Qing | |
| 2016/0372063 A1* | 12/2016 | Li | G11C 19/28 |
| 2017/0032750 A1* | 2/2017 | Shao | G09G 3/3648 |
| 2017/0162153 A1 | 6/2017 | Zhao | |
| 2017/0193885 A1* | 7/2017 | Feng | G11C 19/28 |
| 2017/0193887 A1* | 7/2017 | Wang | G09G 3/2092 |
| 2017/0193946 A1 | 7/2017 | Huang | |
| 2017/0364170 A1* | 12/2017 | Gu | G02F 1/1362 |
| 2018/0040382 A1* | 2/2018 | Gu | G09G 3/3674 |
| 2018/0082652 A1* | 3/2018 | Lv | G09G 3/3677 |
| 2018/0286490 A1* | 10/2018 | Sun | G11C 19/184 |
| 2018/0336856 A1 | 11/2018 | Zhao et al. | |
| 2019/0096350 A1* | 3/2019 | Zhao | G09G 3/3677 |
| 2019/0096352 A1* | 3/2019 | Xue | G09G 3/3677 |
| 2019/0129561 A1* | 5/2019 | Sun | G06F 3/0416 |
| 2019/0180834 A1* | 6/2019 | Yuan | G11C 19/287 |
| 2019/0287446 A1* | 9/2019 | Liao | G11C 19/28 |
| 2019/0325834 A1* | 10/2019 | Feng | G09G 3/3677 |

FOREIGN PATENT DOCUMENTS

| | | |
|---|---|---|
| CN | 105047119 A | 11/2015 |
| CN | 105070263 A | 11/2015 |
| CN | 105609071 A | 5/2016 |
| CN | 106782358 A | 5/2017 |
| CN | 106847223 A | 6/2017 |
| CN | 107516492 A | 12/2017 |
| CN | 207781151 U | 8/2018 |
| JP | 2012252747 A | 12/2012 |

* cited by examiner

SHIFT REGISTER, DRIVING METHOD, GATE DRIVING CIRCUIT AND DISPLAY DEVICE

This application claims priority to the Chinese Patent Application No. 201810002629.8, filed on Jan. 2, 2018 and titled "SHIFT REGISTER UNIT, DRIVING METHOD, GATE DRIVING CIRCUIT AND DISPLAY DEVICE", the disclosure of which is incorporated herein by reference in its entirety.

TECHNICAL FILED

The present disclosure relates to a shift register, a driving method, a gate driving circuit and a display device.

BACKGROUND

When the display device displays an image, there is a need to scan the pixel units by a gate driver on array (GOA). The gate driving circuit (also referred to as a shift register) comprises a plurality of cascaded shift registers. Each shift register corresponds to a row of pixel units. The plurality of rows of pixel units in a display device is subjected to row-by-row scan driving by the plurality of shift registers, thereby enabling the display device to display the image.

SUMMARY

The present disclosure provides a shift register, a driving method, a gate driving circuit and a display device.

According to an aspect of the present disclosure, there is provided a shift register, comprising: a reset circuit, a latch circuit, an output control circuit, and an output circuit, wherein the reset circuit is respectively connected to an input signal end, a reset signal end and a pull-up node, and is configured to provide an input signal from the input signal end for the pull-up node under the control of a reset signal from the reset signal end;

the latch circuit is respectively connected to the input signal end and the pull-up node, and is configured to maintain a potential of the pull-up node to be a second potential when the potential of the pull-up node and a potential of the input signal are both the second potential, and control the potential of the pull-up node to be a first potential when the potential of the input signal is the first potential;

the output control circuit is respectively connected to the pull-up node, a clock signal end, and a control node, and is configured to control a potential of the control node to be the first potential when the potential of the pull-up node is the second potential, and control the potential of the control node to be the second potential when the potential of the pull-up node and the potential of a clock signal from the clock signal end are both the first potential; and the output circuit is respectively connected to the control node and an output end, and is configured to control the potential of the output end to be the second potential when the potential of the control node is the first potential, and control the potential of the output end to be the first potential when the potential of the control node is the second potential.

Optionally, the shift register further comprises: a pull-up node control circuit; and the pull-up node control circuit is respectively connected to an enable signal end and the pull-up node, and is configured to control the potential of the pull-up node to be the second potential under the control of an enable signal from the enable signal end.

Optionally, the reset circuit comprises: a selective inverter; and an input end of the selective inverter is connected to the input signal end, a control end of the selective inverter is connected to the reset signal end, and an output end of the selective inverter is connected to the pull-up node.

Optionally, the reset circuit comprises: a first transistor; and a gate electrode of the first transistor is connected to the reset signal end, a first electrode of the first transistor is connected to the input signal end, and a second electrode of the first transistor is connected to the pull-up node.

Optionally, the latch circuit comprises: an input sub-circuit and a latch sub-circuit;

the input sub-circuit is respectively connected to the input signal end, the pull-up node and a pull-down node, and is configured to control a potential of the pull-down node to the first potential when the potential of the pull-up node and the potential of the input signal are both the second potential, and control the potential of the pull-down node to be the second potential when the input signal is at the first potential; and the latch sub-circuit is respectively connected to the pull-down node and the pull-up node, and is configured to control the potential of the pull-up node to be the second potential when the potential of the pull-down node is the first potential, and control the potential of the pull-up node to be the first potential when the potential of the pull-down node is the second potential.

Optionally, the input sub-circuit comprises: an NOR gate; and a first input end of the NOR gate is connected to the pull-up node, a second input end of the NOR gate is connected to the input signal end, and an output end of the NOR gate is connected to the pull-down node.

Optionally, the input sub-circuit comprises: a second transistor, a third transistor, a fourth transistor, and a fifth transistor;

a gate electrode of the second transistor is connected to the pull-up node, a first electrode of the second transistor is connected to a first power supply end, and a second electrode of the second transistor is connected to a first electrode of the third transistor;

a gate electrode of the third transistor is connected to the input signal end, and a second electrode of the third transistor is connected to the pull-down node;

a gate electrode of the fourth transistor is connected to the input signal end, a first electrode of the fourth transistor is connected to a second power supply end, and a second electrode of the fourth transistor is connected to the pull-down node;

a gate electrode of the fifth transistor is connected to the pull-up node, a first electrode of the fifth transistor is connected to the second power supply end, and a second electrode of the fifth transistor is connected to the pull-down node; and the second transistor has the same polarity as the third transistor, the fourth transistor has the same polarity as the fifth transistor, and the second transistor is opposite in polarity to the fourth transistor.

Optionally, the latch sub-circuit comprises: a first inverter;

an input end of the first inverter is connected to the pull-down node, and an output end of the first inverter is connected to the pull-up node.

Optionally, the latch sub-circuit comprises: a sixth transistor and a seventh transistor;

a gate electrode of the sixth transistor is connected to the pull-down node, a first electrode of the sixth transistor is connected to the first power supply end, and a second electrode of the sixth transistor is connected to the pull-up node;

a gate electrode of the seventh transistor is connected to the pull-down node, a first electrode of the seventh transistor is connected to the second power supply end, and a second electrode of the seventh transistor is connected to the pull-up node; and the sixth transistor is opposite in polarity to the seventh transistor.

Optionally, the output control circuit comprises: an NAND gate; and a first input end of the NAND gate is connected to the pull-up node, a second input end of the NAND gate is connected to the clock signal end, and an output end of the NAND gate is connected to the control node.

Optionally, the output control circuit comprises: an eighth transistor, a ninth transistor, and a tenth transistor;

a gate electrode of the eighth transistor is connected to the pull-up node, a first electrode of the eighth transistor is connected to the first power supply end, and a second electrode of the eighth transistor is connected to the control node;

a gate electrode of the ninth transistor is connected to the pull-up node, a first electrode of the ninth transistor is connected to a second electrode of the tenth transistor, and a second electrode of the ninth transistor is connected to the control node;

a gate electrode of the tenth transistor is connected to the clock signal end, and a first electrode of the tenth transistor is connected to the second power supply end; and the ninth transistor has the same polarity as the tenth transistor, and the eighth transistor is opposite in polarity to the ninth transistor.

Optionally, the output control circuit further comprises: an eleventh transistor;

a gate electrode of the eleventh transistor is connected to the clock signal end, a first electrode of the eleventh transistor is connected to the first power supply end, a second electrode of the eleventh transistor is connected to the control node, and the eleventh transistor has the same polarity as the eighth transistor.

Optionally, the output circuit comprises: a second inverter; and an input end of the second inverter is connected to the control node, and an output end of the second inverter is connected to the output end.

Optionally, the output circuit comprises: a twelfth transistor and a thirteenth transistor;

a gate electrode of the twelfth transistor is connected to the control node, a first electrode of the twelfth transistor is connected to the first power supply end, and a second electrode of the twelfth transistor is connected to the output end;

a gate electrode of the thirteenth transistor is connected to the control node, a first electrode of the thirteenth transistor is connected to the second power supply end, and a second electrode of the thirteenth transistor is connected to the output end; and the twelfth transistor is opposite in polarity to the thirteenth transistor.

Optionally, the pull-up node control circuit comprises: a fourteenth transistor; and a gate electrode of the fourteenth transistor is connected to the enable signal end, a first electrode of the fourteenth transistor is connected to the second power supply end, and a second electrode of the fourteenth transistor is connected to the pull-up node.

According to another aspect of the present disclosure, there is provided a driving method for a shift register, wherein the shift register comprises: a reset circuit, a latch circuit, an output control circuit, and an output circuit, and the method comprises:

in a charging stage, the input signal output by an input signal end being at a first potential, controlling, by the latch circuit, the potential of a pull-up node to be the first potential under the control of the input signal;

in an output stage, the clock signal output by a clock signal end being at the first potential, maintaining the pull-up node to be at the first potential, controlling, by the output control circuit, the potential of a control node to be a second potential under control of the pull-up node and the clock signal; and controlling, by the output circuit, the potential of an output end to be the first potential under control of the control node; and in a reset stage, the reset signal output by a reset signal end being at the first potential, the input signal being at the second potential, controlling, by the reset circuit, the potential of the pull-up node to be the second potential under control of the reset signal; maintaining, by the latch circuit, the potential of the pull-up node to be the second potential under the control of the pull-up node and the input signal; controlling, by the output control circuit, the potential of the control node to be the first potential under the control of the pull-up node; and controlling, by the output circuit, the potential of the output end to be the second potential under the control of the control node.

Optionally, the shift register further comprises: a pull-up node control circuit, and the method further comprises:

in a maintaining stage, the enable signal output by an enable signal end being at the first potential, controlling, by the pull-up node control circuit, the potential of the pull-up node to be the second potential under control of the enable signal; controlling, by the output control circuit, the potential of the control node to be the first potential under the control of the pull-up node; and controlling, by the output circuit, the potential of the output end to be the second potential under the control of the control node.

Optionally, wherein the latch circuit comprises: an input sub-circuit and a latch sub-circuit;

controlling, by the latch circuit, the potential of the pull-up node to be the first potential under control of the input signal comprises:

controlling, by the input sub-circuit, the potential of a pull-down node to be the second potential under the control of the input signal; and controlling, by the latch sub-circuit, the potential of the pull-up node to be the first potential under the control of the pull-down node; and maintaining, by the latch circuit, the potential of the pull-up node to be the second potential under the control of the pull-up node and the input signal comprises:

controlling, by the input sub-circuit, the potential of the pull-down node to be the first potential under the control of the pull-up node and the input signal; and controlling, by the latch sub-circuit, the potential of the pull-up node to be the second potential under the control of the pull-down node.

According to yet another aspect of the present disclosure, there is provided a gate driving circuit, comprising a plurality of cascaded shift registers, the shift register comprising: a reset circuit, a latch circuit, an output control circuit, and an output circuit, wherein the reset circuit is respectively connected to an input signal end, a reset signal end and a pull-up node, and is configured to provide an input signal from the input signal end for the pull-up node under the control of a reset signal from the reset signal end;

the latch circuit is respectively connected to the input signal end and the pull-up node, and is configured to maintain a potential of the pull-up node to be a second potential when the potential of the pull-up node and a potential of the input signal are both the second potential, and control the potential of the pull-up node to be a first potential when the potential of the input signal is the first potential;

the output control circuit is respectively connected to the pull-up node, a clock signal end, and a control node, and is configured to control a potential of the control node to be the first potential when the potential of the pull-up node is the second potential, and control the potential of the control node to be the second potential when the potential of the pull-up node and the potential of a clock signal from the clock signal end are both the first potential; and the output circuit is respectively connected to the control node and an output end, and is configured to control the potential of the output end to be the second potential when the potential of the control node is the first potential, and control the potential of the output end to be the first potential when the potential of the control node is the second potential.

According to still yet another aspect of the present disclosure, there is provided a display device, comprising the gate driving circuit in the another aspect.

According to still yet another aspect of the present disclosure, there is provided a storage medium, including computer programs therein, wherein the computer programs, when executed by a processor, implement the driving method of the shift register in the another aspect.

DETAILED DESCRIPTION

Figure 1:
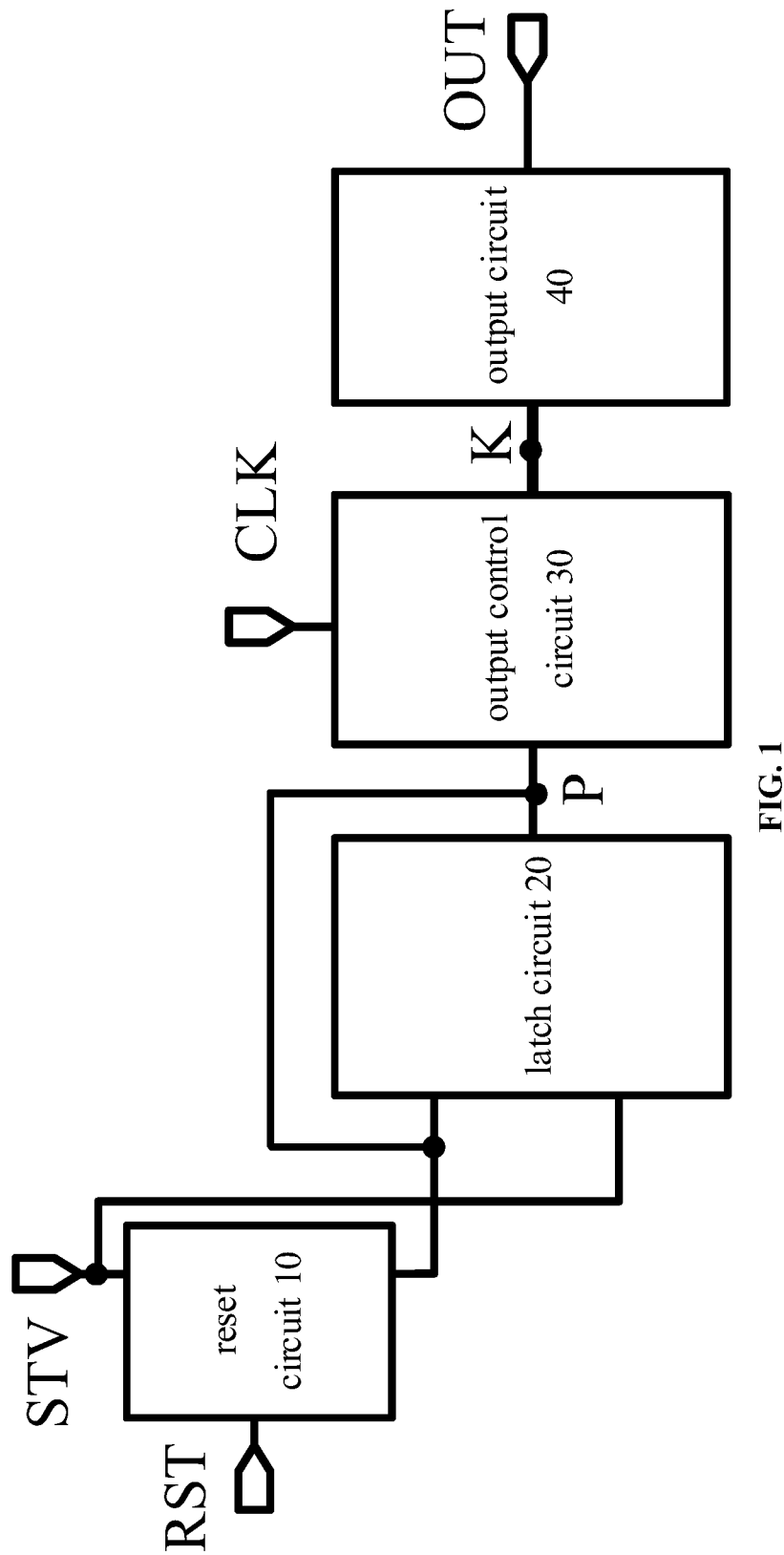
FIG. 1 is a schematic diagram of a structure of a shift register according to an embodiment of the present disclosure.

The present disclosure will be described in further detail with reference to the enclosed drawings, to clearly present the principles and advantages of the present disclosure.

Transistors adopted in all the embodiments of the present disclosure may be thin-film transistors or field-effect transistors or other devices having the similar features. According to the function in a circuit, the transistors adopted in the embodiments of the present disclosure are generally switching transistors. Since a source and drain of the switching transistor adopted herein are symmetric, the source and drain may be exchanged. In the embodiments of the present disclosure, the source is referred to as a first electrode and the drain is referred to as a second electrode. According to form in the drawings, it is specified that a middle part of a transistor is the gate, a signal input terminal is the source, and a signal output terminal is the drain. The switching transistors adopted in the embodiments of the present disclosure may include any of P-type switching transistors and N-type transistors. The P-type switching transistor is turned on when the gate is at a low potential, and is turned off when the gate is at a high potential. The N-type switching transistor is turned on when the gate is at a high potential, and is turned off when the gate is at a low potential. In various embodiments of the present disclosure, each of a plurality of signals has a first potential and a second potential. The first potential and the second potential only indicate that the potential of the signal has two different states, instead of indicating that the first potential or the second potential herein has a specific value.

In the following embodiments of the present disclosure, the fact that the first potential is a high potential relative to the second potential is taken as an example for explanation.

FIG. 1 is a schematic diagram of a structure of a shift register according to an embodiment of the present disclosure. As shown in the figure, the shift register may include: a reset circuit 10, a latch circuit 20, an output control circuit 30, and an output circuit 40 connected in sequence.

The reset circuit 10 is respectively connected to an input signal end STV, a reset signal end RST and a pull-up node P, and is configured to provide an input signal from the input signal end STV for the pull-up node P under the control of a reset signal from the reset signal end RST. For example, the reset circuit 10 may provide an input signal at the second potential for the pull-up node P when the potential of the reset signal is the first potential.

The latch circuit 20 is respectively connected to the input signal end STV and the pull-up node P, and is configured to maintain a potential of the pull-up node to be a second potential when the potential of the pull-up node P and a potential of the input signal are both the second potential, and control the potential of the pull-up node P to be a first potential when the potential of the input signal is the first potential. In this case, the shift signal (i.e., the signal transmitted in the shift register) can be statically stored by the latch circuit 20, thereby effectively saving power consumption and improving the anti-interference ability of the signal transmitted in the shift register.

The output control circuit 30 is respectively connected to the pull-up node P, a clock signal end CLK, and a control node K, and is configured to control a potential of the control node K to be the first potential when the potential of the pull-up node P is the second potential, and control the potential of the control node K to be the second potential when the potential of the pull-up node P and the potential of a clock signal from the clock signal end CLK are both the first potential.

The output circuit 40 is respectively connected to the control node K and an output end OUT, and is configured to control the potential of the output end OUT to be the second potential when the potential of the control node K is the first potential, and control the potential of the output end OUT to be the first potential when the potential of the control node K is the second potential.

In summary, the shift register provided by the embodiment of the present disclosure comprises the reset circuit, the latch circuit, the output control circuit, and the output circuit, which are series connected in sequence. By controlling the potential of the pull-up node according to the input signal through the latch circuit, the potential of the pull-up node and the potential of the input signal can be consistent, and thus the shift signal can be statically stored, thereby effectively saving power consumption and improving the anti-interference ability of the signal transmitted in the shift register.

Figure 2:
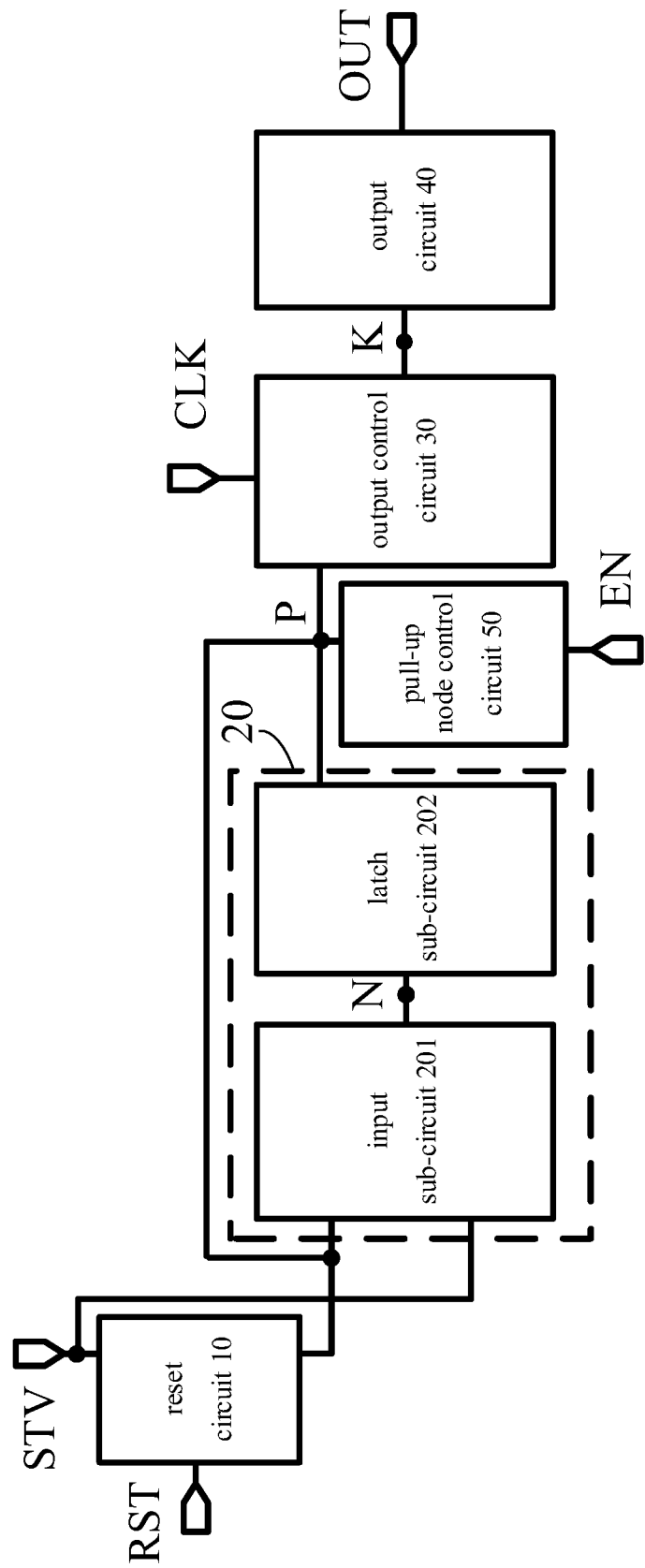
FIG. 2 is a schematic diagram of a structure of another shift register according to an embodiment of the present disclosure.

FIG. 2 is a schematic diagram of a structure of another shift register according to an embodiment of the present disclosure. As shown in FIG. 2, the shift register unit further include: a pull-up node control circuit 50. The pull-up node control circuit 50 is respectively connected to an enable signal end EN and a pull-up node P, and is configured to control the potential of the pull-up node P to be the second potential under the control of an enable signal from the enable signal end En to reduce noise for the pull-up node P, so as to reduce noise for the output end OUT. Thus, all rows of pixel in the display panel are in a dark state to discharge the display panel. For example, the pull-up node control circuit 50 may control the potential of the pull-up node P to be the second potential when the enable signal output from the enable signal end EN is the first potential.

With continued reference to FIG. 2, the latch circuit 20 may include: an input sub-circuit 201 and a latch sub-circuit 202.

As shown in FIG. 2, the input sub-circuit 201 is respectively connected to the input signal end STV, the pull-up node P and a pull-down node N, and is configured to control a potential of the pull-down node N to the first potential when the potential of the pull-up node P and the potential of the input signal are both the second potential, and control the potential of the pull-down node N to be the second potential when the input signal is at the first potential.

As shown in FIG. 2, The latch sub-circuit 202 is respectively connected to the pull-down node N and the pull-up node P, and is configured to control the potential of the pull-up node P to be the second potential when the potential of the pull-down node N is the first potential, and control the potential of the pull-up node P to be the first potential when the potential of the pull-down node N is the second potential.

Figure 3:
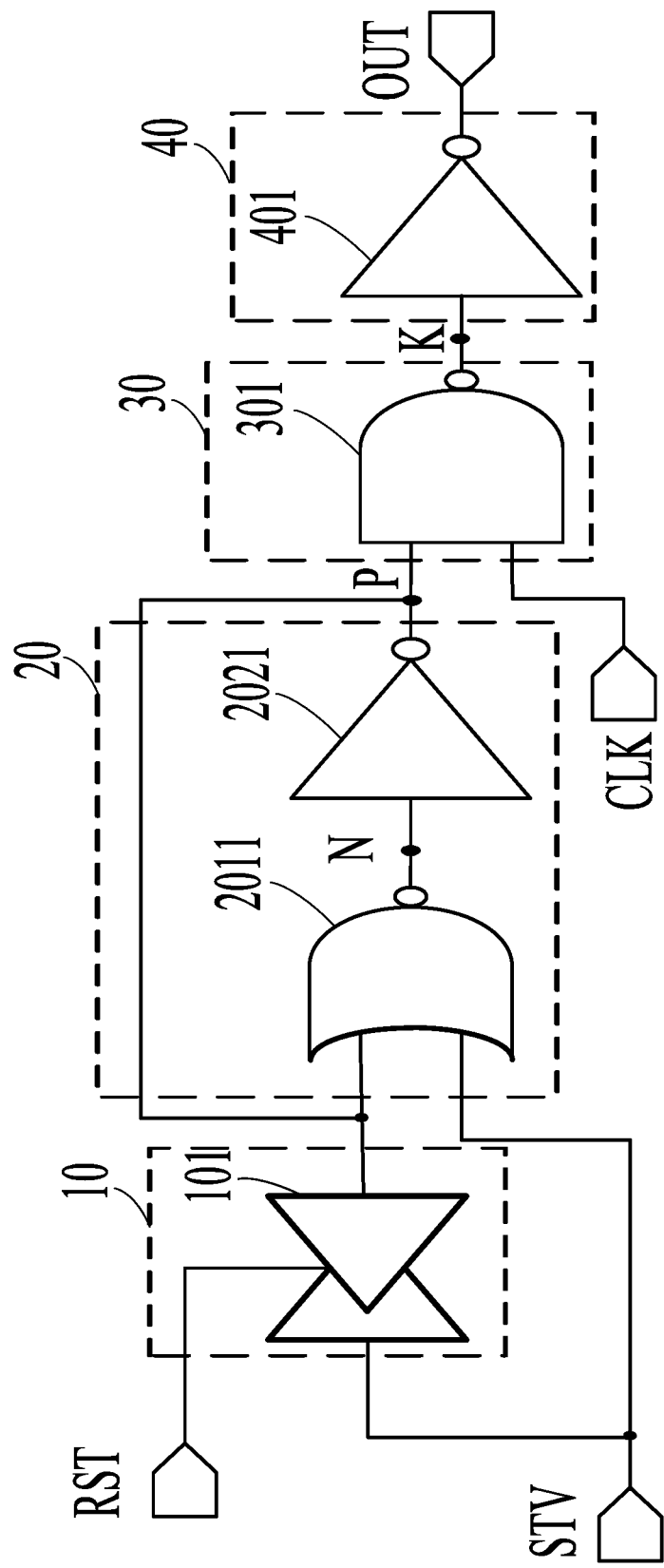
FIG. 3 is a schematic diagram of a structure of yet another shift register according to an embodiment of the present disclosure.

FIG. 3 is a schematic diagram of a structure of yet another shift register according to an embodiment of the present disclosure. FIG. 3 is a schematic diagram of a circuit in which the reset circuit 10, the input sub-circuit 201, the latch sub-circuit 202, the output control circuit 30 and the output circuit 40 are implemented by a logic circuit.

As shown in FIG. 3, the reset circuit 10 may include: a selective inverter 101. The input end of the selective inverter 101 is connected to the input signal end STV, the control end of the selective inverter 101 is connected to the reset signal end RST, and the output end of the selective inverter 101 is connected to the pull-up node P.

With continued reference to FIG. 3, the input sub-circuit 201 may comprise: an NOR gate 2011. A first input end of the NOR gate 2011 is connected to the pull-up node P. A second input end of the NOR gate 2011 is connected to the input signal end STV. The output end of the NOR gate 2011 is connected to the pull-down node N. When the input sub-circuit 201 is implemented by the NOR gate 2011, if the signals input by the first input end and the second input end of the NOR gate 2011 are both at the low potential, the signal output by the output end of the NOR gate 2011 is at the high potential. If the signal input by any of the first input end and the second input end of the NOR gate 2011 is at the high potential, the signal output by the output end of the NOR gate 2011 is at the low potential.

With continued reference to FIG. 3, the latch sub-circuit 202 may comprise a first inverter 2021. The input end of the first inverter 2021 is connected to the pull-down node N. The output end of the first inverter 2021 is connected to the pull-up node P. When the latch sub-circuit 202 is implemented by the first inverter 2021, the potential of the pull-up node P can be controlled according to the potential of the pull-down node N, thereby charging the pull-up node P or resetting the pull-up node P.

With continued reference to FIG. 3, the output control circuit 30 may comprise an NAND gate 301. A first input end of the NAND gate 301 is connected to the pull-up node P. A second input end of the NAND gate 301 is connected to a clock signal end CLK. The output end of the NAND gate 301 is connected to a control node K. When the output control circuit 30 is implemented by the NAND gate 301, if the signals input by the first input end and the second input end of the NAND gate 301 are both at the high potential, the output end of the NAND gate 301 outputs the low potential. If the signal input by any of the first input end and the second input end of the NAND gate 301 is at the high potential, the signal output by the output end of the NAND gate 301 is at the high potential.

With continued reference to FIG. 3, the output circuit 40 may comprise a second inverter 401. The input end of the second inverter 401 is connected to the control node K. The output end of the second inverter 401 is connected to the output end OUT. When the output circuit 40 is implemented by the second inverter 401, the signal of the input end of the inverter is opposite in potential to the signal of the output end OUT, thereby ensuring the stability of the signal output by the output circuit 40.

When at least one of the reset circuit 10, the input sub-circuit 201, the latch sub-circuit 202, the output control circuit 30 and the output circuit 40 is implemented by a logic circuit, the layout area occupied by the gate driving circuit in the display device can be further reduced.

Figure 4:
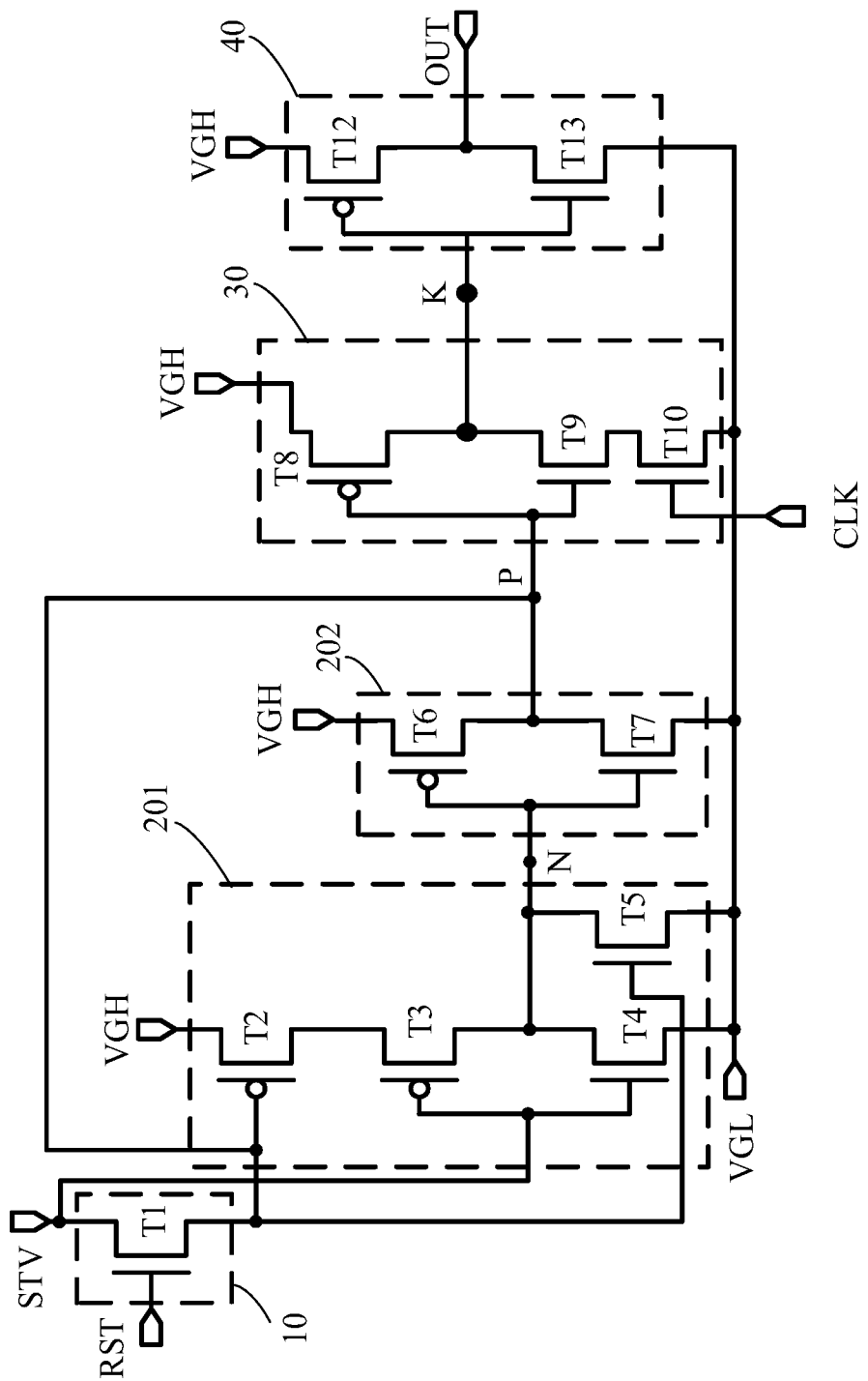
FIG. 4 is a schematic diagram of a structure of still yet another shift register according to an embodiment of the present disclosure.

FIG. 4 is a schematic diagram of a structure of still yet another shift register according to an embodiment of the present disclosure. FIG. 4 is a schematic diagram of a circuit in which the shift register is implemented by a transistor.

Referring to FIG. 4, the reset circuit 10 may include: a first transistor T1. The gate electrode of the first transistor T1 is connected to the reset signal end RST, the first electrode of the first transistor T1 is connected to the input signal end STV, and the second electrode of the first transistor T1 is connected to the pull-up node P.

With continued reference to FIG. 4, the input sub-circuit 201 may include: a second transistor T2, a third transistor T3, a fourth transistor T4, and a fifth transistor T5.

The gate electrode of the second transistor T2 is connected to the pull-up node P, the first electrode of the second transistor T2 is connected to a first power supply end VGH, and the second electrode of the second transistor T2 is connected to the first electrode of the third transistor T3.

The gate electrode of the third transistor T3 is connected to the input signal end STV and the second electrode of the third transistor T3 is connected to the pull-down node N.

The gate electrode of the fourth transistor T4 is connected to the input signal end STV, the first electrode of the fourth transistor T4 is connected to a second power supply end VGL, and the second electrode of the fourth transistor T4 is connected to the pull-down node N.

The gate electrode of the fifth transistor T5 is connected to the pull-up node P, the first electrode of the fifth transistor T5 is connected to the second power supply end VGL, and the second electrode of the fifth transistor T5 is connected to the pull-down node N.

In a possible implementation, the second transistor T2 has the same polarity as the third transistor T3, the fourth transistor T4 has the same polarity as the fifth transistor T5, and the second transistor T2 is opposite in polarity to the fourth transistor T4. For example, as shown in FIG. 4, the second transistor T2 and the third transistor T3 are P-type transistors, and the fourth transistor T4 and fifth transistor T5 are N-type transistors.

With continued reference to FIG. 4, the latch sub-circuit 202 includes: a sixth transistor T6 and a seventh transistor T7.

The gate electrode of the sixth transistor T6 is connected to the pull-down node N, the first electrode of the sixth transistor T6 is connected to the first power supply end VGH, and the second electrode of the sixth transistor T6 is connected to the pull-up node P.

The gate electrode of the seventh transistor T7 is connected to the pull-down node N, the first electrode of the seventh transistor T7 is connected to the second power supply end VGL, and the second electrode of the seventh transistor T7 is connected to the pull-up node P.

In a possible implementation, the sixth transistor T6 in opposite in polarity to the seventh transistor T7. For example, as shown in FIG. 4, the sixth transistor T6 is a P-type transistor and the seventh transistor T7 is an N-type transistor.

With continued reference to FIG. 4, the output control circuit 30 may include: an eighth transistor T8, a ninth transistor T9, and a tenth transistor T10.

The gate electrode of the eighth transistor T8 is connected to the pull-up node P, the first electrode of the eighth transistor T8 is connected to the first power supply end VGH, and the second electrode of the eighth transistor T8 is connected to the control node K.

The gate electrode of the ninth transistor T9 is connected to the pull-up node P, the first electrode of the ninth transistor T9 is connected to the second electrode of the tenth transistor T10, and the second electrode of the ninth transistor T9 is connected to the control node K.

The gate electrode of the tenth transistor T10 is connected to the clock signal end CLK, and the first electrode of the tenth transistor T10 is connected to the second power supply end VGL.

In a possible implementation, the ninth transistor T9 has the same polarity as the tenth transistor T10, and the eighth transistor T8 is opposite in polarity to the ninth transistor T9.

For example, as shown in FIG. 4, the eighth transistor T8 is a P-type transistor and the ninth transistor T9 and the tenth transistor T10 are N-type transistors.

Figure 5:
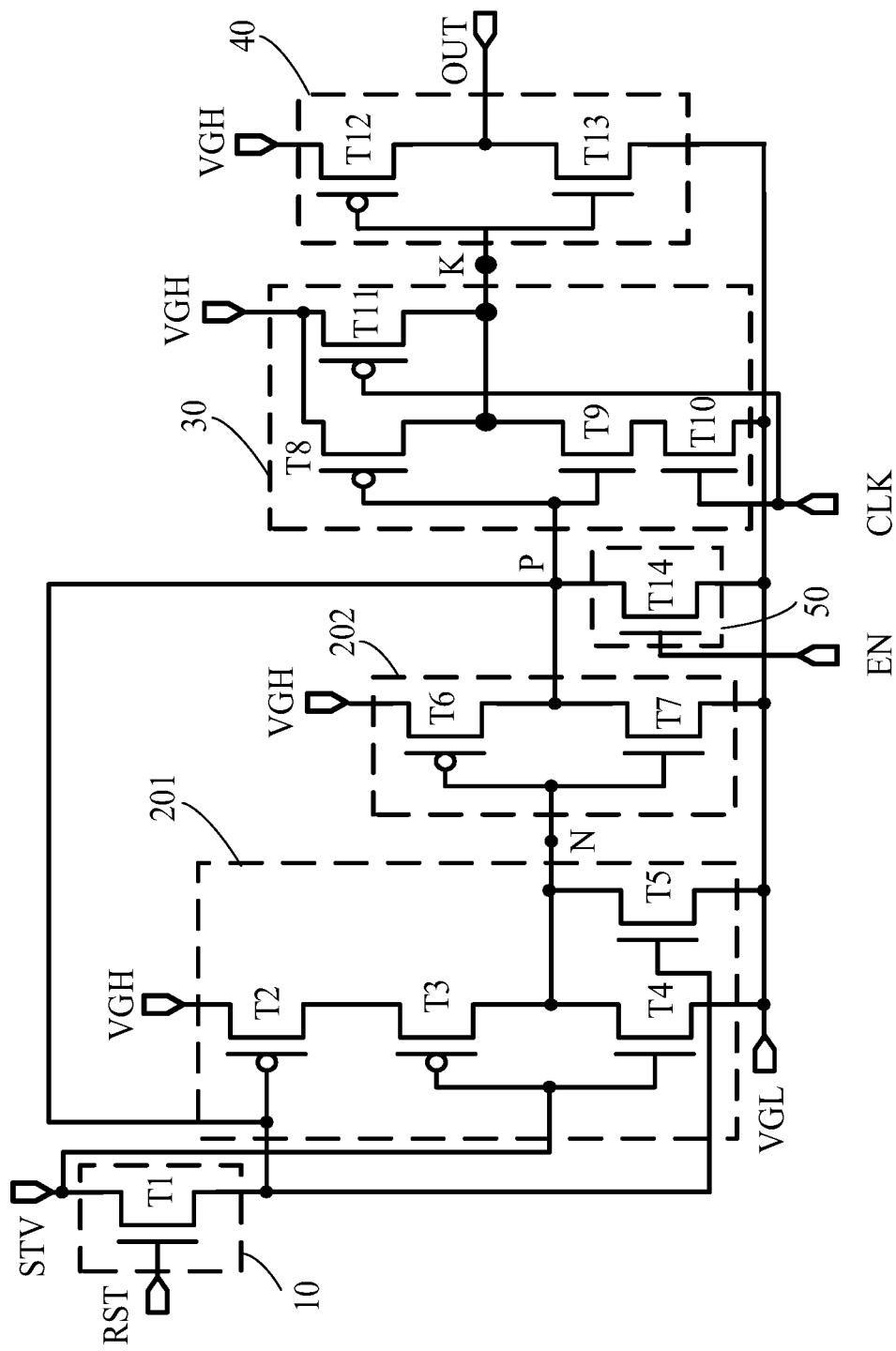
FIG. 5 is a schematic diagram of a structure of still yet another shift register according to an embodiment of the present disclosure.

FIG. 5 is a schematic structural diagram of another shift register according to an embodiment of the present disclosure. As shown in FIG. 5, the output control circuit 30 may further comprise: an eleventh transistor T11.

A gate electrode of the eleventh transistor T11 is connected to the clock signal end CLK. A first electrode of the eleventh transistor T11 is connected to a first power supply end VGH. A second electrode of the eleventh transistor T11 is connected to the control node K. The eleventh transistor T11 has the same polarity as the eighth transistor T8. For example, as shown in FIG. 5, the eleventh transistor T11 is a P-type transistor. In such implementation, by controlling the eleventh transistor T11 through the clock signal output from the clock signal end CLK, the stability of the control over the potential of the control node K can be improved, thereby further ensuring the stability of the voltage output by the output circuit 40.

With continued reference to FIG. 4 and FIG. 5, the output circuit 40 may comprise a twelfth transistor T12 and a thirteenth transistor T13.

A gate electrode of the twelfth transistor T12 is connected to the control node K. A first electrode of the twelfth transistor T12 is connected to the first power supply end VGH. A second electrode of the twelfth transistor T12 is connected to the output end OUT.

A gate electrode of the thirteenth transistor T13 is connected to the control node K. A first electrode of the thirteenth transistor T13 is connected to a second power supply end VGL. A second electrode of the thirteenth transistor T13 is connected to the output end OUT. The twelfth transistor T12 is opposite in polarity to the thirteenth transistor T13. For example, as shown in FIG. 4 or FIG. 5, the twelfth transistor T12 is a P-type transistor, and the thirteenth transistor T13 is an N-type transistor.

With continued reference to FIG. 5, the pull-up node control circuit 50 may comprise a fourteenth transistor T14. A gate electrode of the fourteenth transistor T14 is connected to an enable signal end EN. A first electrode of the fourteenth transistor T14 is connected to the second power supply end VGL. A second electrode of the fourteenth transistor T14 is connected to the pull-up node P.

By controlling the potential of the pull-up node through the latch circuit, a shift signal transmitted in the shift register can be statically stored to realize the phase delay of the pulse signal input by the input signal end. By controlling the potential of the control node through the output control circuit 30, the magnitude of the phase delay can be adjusted, and the width of the pulse signal can be modulated accordingly. In addition, the output module can control the potential of the output end according to the control node.

Moreover, the shift register provided by the embodiment of the present disclosure may also be implemented by the logic circuit and the transistors together. For example, the reset circuit 10 and the input sub-circuit 201 may both be implemented by the transistors, and the latch sub-circuit 202, the output control circuit 30, and the output circuit 40 may be implemented by the logic circuit.

In summary, the shift register provided by the embodiment of the present disclosure comprises the reset circuit, the latch circuit, the output control circuit, and the output circuit, which are series connected in sequence. By controlling the potential of the pull-up node according to the input signal through the latch circuit, the potential of the pull-up node and the potential of the input signal can be consistent, and thus the shift signal can be statically stored, thereby effectively saving power consumption and improving the anti-interference ability of the signal transmitted in the shift register.

Figure 6:
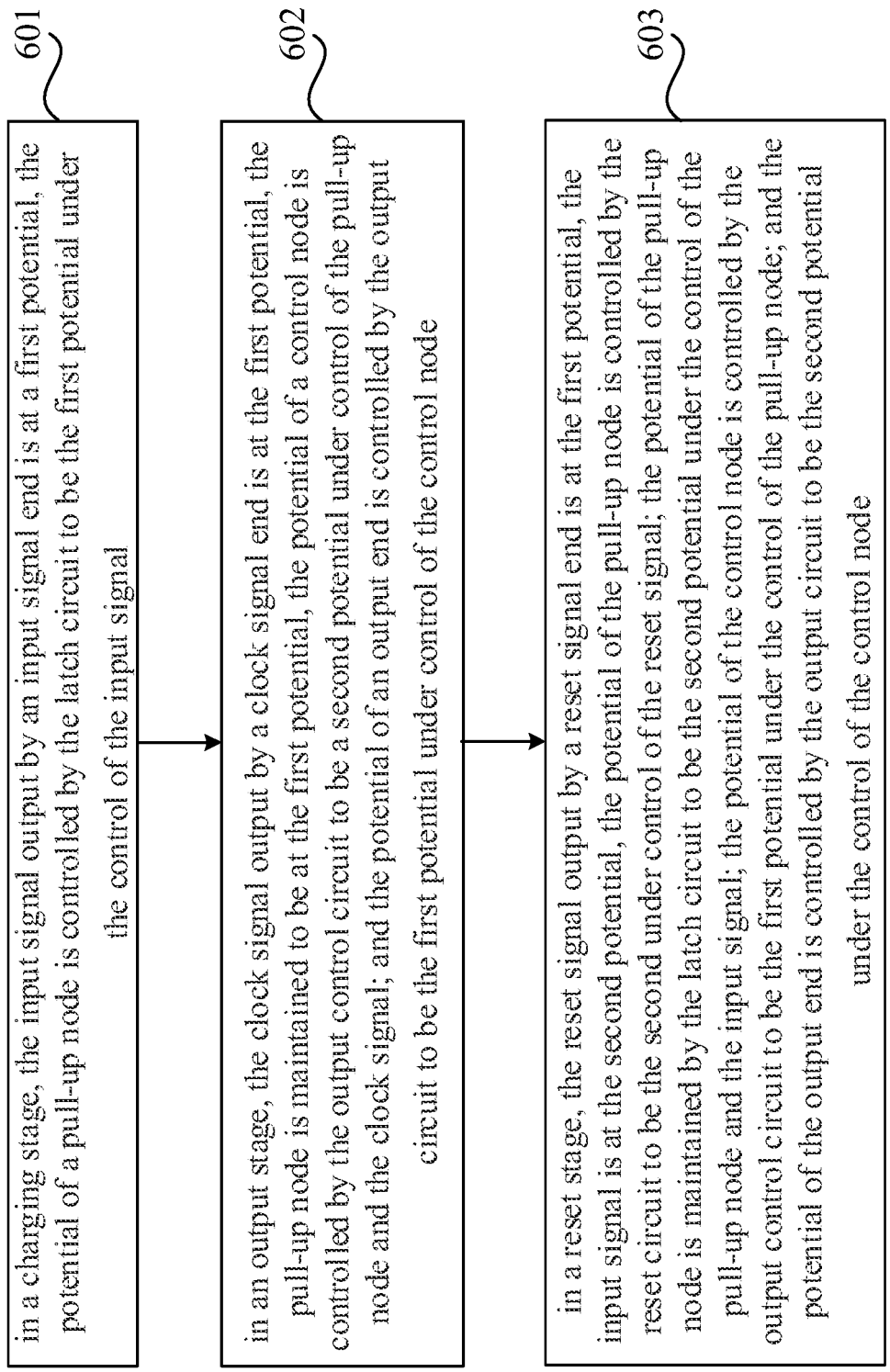
FIG. 6 is a flow chart of a driving method for a shift register according to an embodiment of the present disclosure.

FIG. 6 is a flow chart of a driving method for a shift register according to an embodiment of the present disclosure. The method may be used to drive the shift register in any of FIG. 1 to FIG. 5. As shown in FIG. 6, the method may include the following working processes.

In step 601, in a charging stage, the input signal output by an input signal end is at a first potential, the potential of a pull-up node is controlled by the latch circuit to be the first potential under the control of the input signal.

In step 602, in an output stage, the clock signal output by a clock signal end is at the first potential, the pull-up node is maintained to be at the first potential, the potential of a control node is controlled by the output control circuit to be a second potential under control of the pull-up node and the clock signal; and the potential of an output end is controlled by the output circuit to be the first potential under control of the control node.

In step 603, in a reset stage, the reset signal output by a reset signal end is at the first potential, the input signal is at the second potential, the potential of the pull-up node is controlled by the reset circuit to be the second under control of the reset signal; the potential of the pull-up node is maintained by the latch circuit to be the second potential under the control of the pull-up node and the input signal; the potential of the control node is controlled by the output control circuit to be the first potential under the control of the pull-up node; and the potential of the output end is controlled by the output circuit to be the second potential under the control of the control node.

In summary, the driving method for a shift register provided by the embodiment of the present disclosure may comprise a charging stage, an output stage, and a reset stage, and the shift register comprises the reset circuit, the latch circuit, the output control circuit and the output circuit, which are series connected in sequence. By controlling the potential of the pull-up node according to the input signal through the latch circuit, the potential of the pull-up node and the potential of the input signal can be consistent, and thus the shift signal can be statically stored, thereby effectively saving power consumption and improving the anti-interference ability of the signal transmitted in the shift register.

Figure 7:
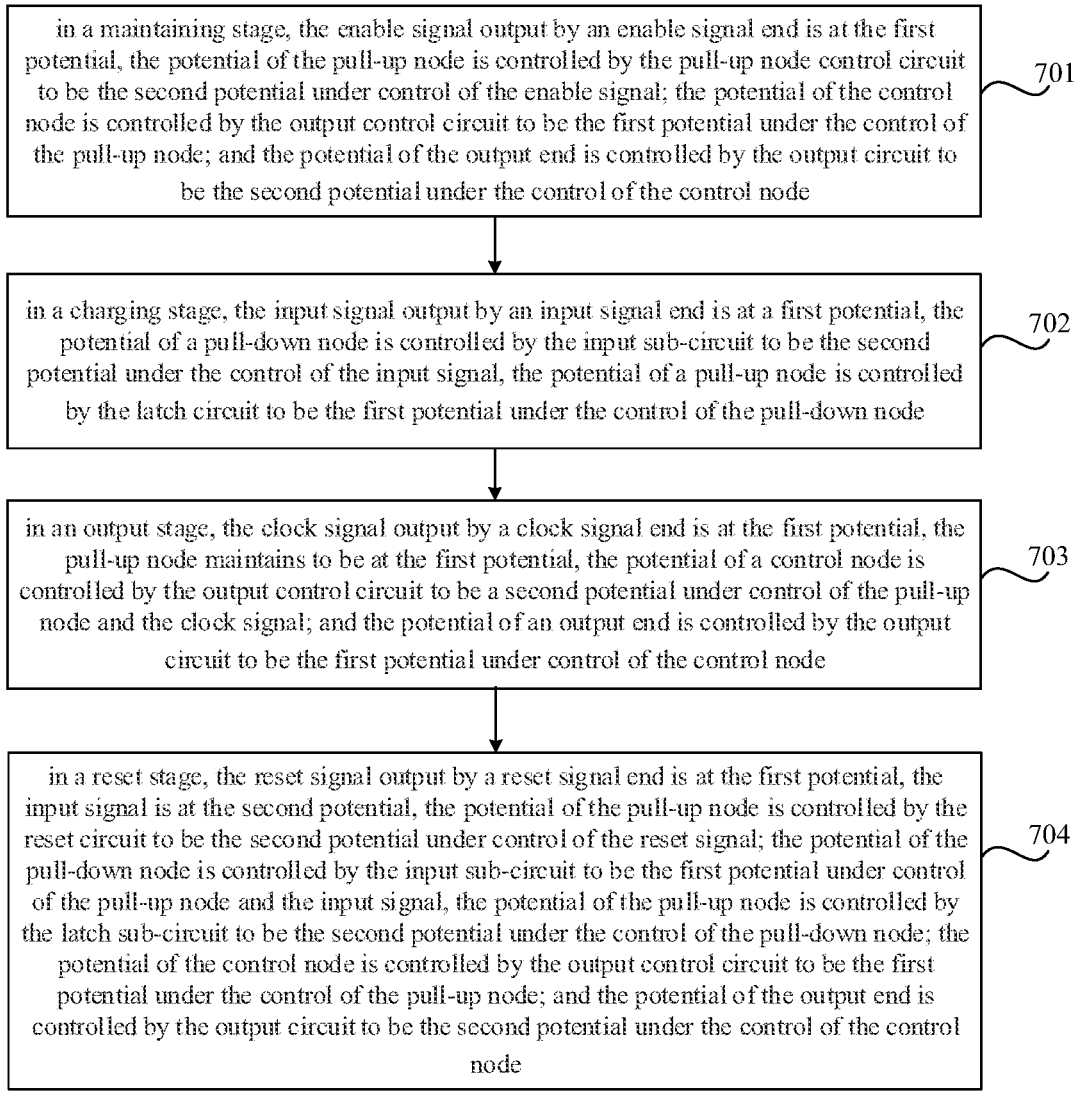
FIG. 7 is a flow chart of an another driving method for a shift register according to an embodiment of the present disclosure.

FIG. 7 is a flow chart of a driving method for another shift register according to an embodiment of the present disclosure. As shown in FIG. 7, the method may include the following working processes.

In step 701, in a maintaining stage, the enable signal output by an enable signal end is at the first potential, the potential of the pull-up node is controlled by the pull-up node control circuit to be the second potential under control of the enable signal; the potential of the control node is controlled by the output control circuit to be the first potential under the control of the pull-up node; and the potential of the output end is controlled by the output circuit to be the second potential under the control of the control node.

In step 702, in a charging stage, the input signal output by an input signal end is at a first potential, the potential of a pull-down node is controlled by the input sub-circuit to be the second potential under the control of the input signal, the potential of a pull-up node is controlled by the latch circuit to be the first potential under the control of the pull-down node.

In step 703, in an output stage, the dock signal output by a clock signal end is at the first potential, the pull-up node maintains to be at the first potential, the potential of a control node is controlled by the output control circuit to be a second potential under control of the pull-up node and the clock signal; and the potential of an output end is controlled by the output circuit to be the first potential under control of the control node.

In step 704, in a reset stage, the reset signal output by a reset signal end is at the first potential, the input signal is at the second potential, the potential of the pull-up node is controlled by the reset circuit to be the second potential under control of the reset signal; the potential of the pull-down node is controlled by the input sub-circuit to be the first potential under control of the pull-up node and the input signal, the potential of the pull-up node is controlled by the latch sub-circuit to be the second potential under the control of the pull-down node; the potential of the control node is controlled by the output control circuit to be the first potential under the control of the pull-up node; and the potential of the output end is controlled by the output circuit to be the second potential under the control of the control node.

In summary, the driving method for a shift register provided by the embodiment of the present disclosure may comprise a charging stage, an output stage, and a reset stage, and the shift register comprises the reset circuit, the latch circuit, the output control circuit and the output circuit, which are series connected in sequence. By controlling the potential of the pull-up node through the latch circuit, the shift signal can be statically stored, thereby effectively saving power consumption and improving the anti-interference ability of the signal transmitted in the shift register.

Figure 8:
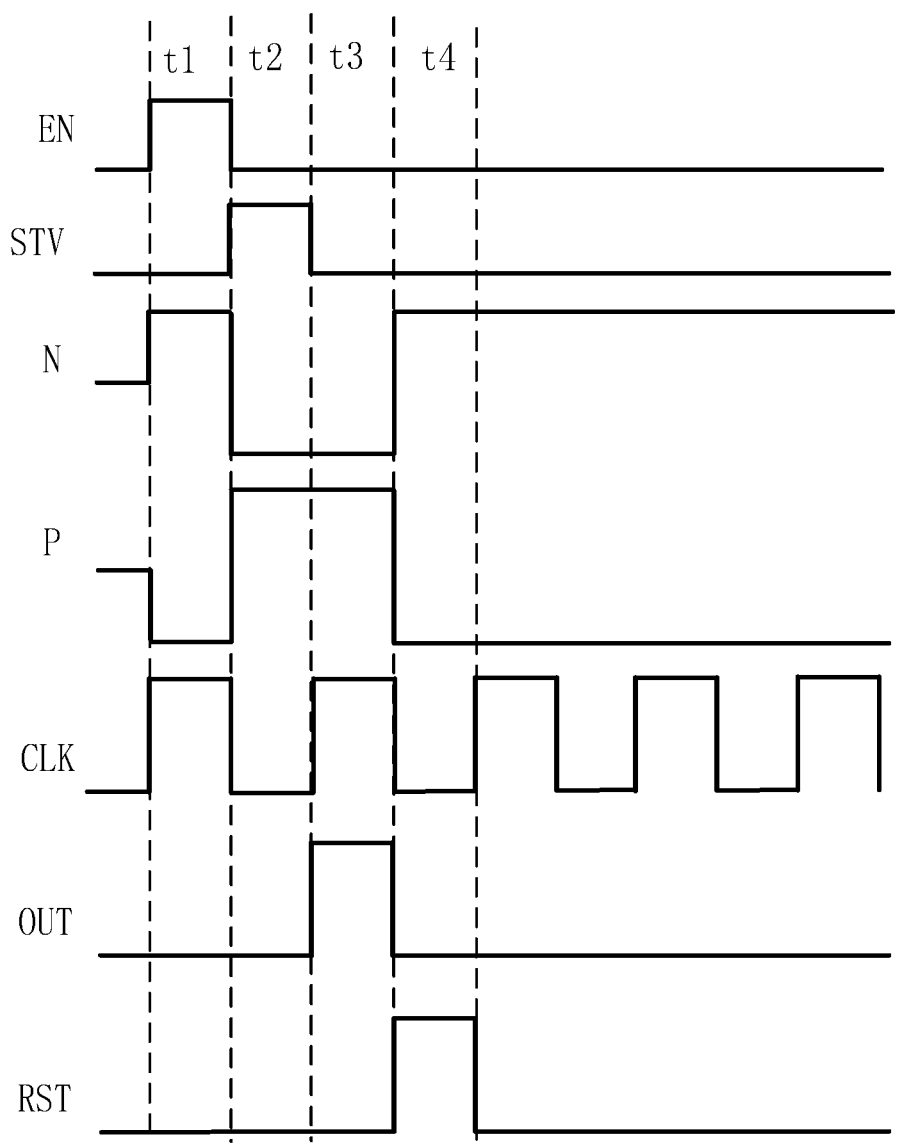
FIG. 8 is a timing sequence diagram of a driving process of a shift register according to an embodiment of the present disclosure.

FIG. 8 is a timing sequence diagram of a driving process for a shift register according to an embodiment of the present disclosure. The driving principle for the shift register provided by the embodiment of the present disclosure is described in detail below by taking the shift register shown in FIG. 5 as an example.

Referring to FIG. 8, in the maintaining stage t1, an enable signal output by the enable signal end EN is at the first potential, an input signal output by the input signal end STV is at the second potential, a first power supply signal output by the first power supply end VGH is at the first potential, and a second power supply signal output by the second power supply end VGL is at the second potential. At this point, the fourteenth transistor T14 is turned on under the action of the enable signal, and the second power supply end VGL inputs the second power supply signal to the pull-up node P through the fourteenth transistor T14, to achieve noise reduction on the pull-up node P. Under the driving of the pull-up node P, the eighth transistor T8 is turned on, and the first power supply end VGH inputs the first power supply signal to the control node K through the eighth transistor T8. Under the driving of the control node K, the thirteenth transistor T13 is turned on, and the second power supply end VGL inputs the second power supply signal to the output end OUT through the thirteenth transistor T13, to perform noise reduction on the output end OUT, thereby realizing the discharging of the display panel.

In addition, the second transistor T2 is turned on under the driving of the pull-up node P. The third transistor T3 is turned on under the control of the input signal. The first power supply end VGH may input the first power supply signal to the pull-down node N through the second transistor T2 and the third transistor T3. The seventh transistor T7 is turned on under the driving of the pull-down node N, and the second power supply end VGL inputs the second power supply signal to the pull-up node P through the seventh transistor T7 to stabilize the voltage of the pull-up node P, thereby ensuring effective noise reduction of the pull-up node P.

In the charging stage t2, the input signal output by the input signal end STV is at the first potential, a clock signal output by the clock signal end CLK is at the second potential, the first power supply signal output by the first power supply end VGH is at the first potential, and the second power supply signal output by the second power supply end VGL is at the second potential. At this point, the fourth transistor T4 is turned on under the control of the input signal, and the second power supply end VGL inputs the second power supply signal to the pull-down node N through the fourth transistor T4. Under the driving of the pull-down node N, the sixth transistor T6 is turned on, and the first power supply end VGH inputs the first power supply signal to the pull-up node P by the sixth transistor T6 to charge the pull-up node P. In addition, the eleventh transistor T11 is turned on under the control of the clock signal, and the first power supply end VGH inputs the first power supply signal to the control node K through the eleventh transistor T11. Under the driving of the control node K, the thirteenth transistor T13 is turned on, and the second power supply end VGL inputs the second power supply signal to the output end OUT through the thirteenth transistor T13.

In the output stage t3, the clock signal output by the clock signal end CLK is at the first potential, the first power supply signal output by the first power supply end VGH is at the first potential, and the second power supply signal output by the second power supply end VGL is at the second potential. The tenth transistor T10 is turned on under the control of the clock signal. Since the pull-up node P is maintained to be the first potential, the ninth transistor T9 is turned on under the driving of the pull-up node P. The second power supply end VGL inputs the second power supply signal to the control node K through the tenth transistor T10 and the ninth transistor T9. Under the driving of the control node K, the twelfth transistor T12 is turned on, and the first power supply end VGH inputs the first power supply signal to the output end OUT through the twelfth transistor T12 to drive pixel units in the display panel.

In addition, the fifth transistor T5 is turned on under the driving of the pull-up node P, and the second power supply end VGL inputs the second power supply signal to the pull-down node N through the fifth transistor T5. Under the driving of the pull-down node N, the sixth transistor T6 is turned on, and the first power supply end VGH inputs the first power supply signal to the pull-up node P through the sixth transistor T6. Moreover, since the gate electrode of the twelfth transistor T12 and the gate electrode of the thirteenth transistor T13 are both connected to the control node K, and the polarities of the twelfth transistor T12 and the thirteenth transistor T13 are opposite, the thirteenth transistor T13 is turned off when the control node K is at the second potential. Therefore, the influence of other signals on the potential of the output end OUT can be avoided, and the stability of the output signal of the shift register is further ensured.

In the reset stage t4, a reset signal output by the reset signal end RST is at the first potential, the input signal output by the input signal end STV is at the second potential, the clock signal output by the clock signal end CLK is at the second potential, the first power supply signal output by the first power supply end VGH is at the first potential, and the second power supply signal output by the second power supply end VGL is at the second potential. At this point, the first transistor T1 is turned on under the control of the reset signal, and the input signal end STV inputs the input signal at the second potential to the pull-up node P through the first transistor T1, so as to reset the pull-up node P. The second transistor T2 is turned on under the driving of the pull-up node P, and the third transistor T3 is turned on under the control of the input signal at the second potential, so that the first power supply end VGH inputs the first power supply signal to the pull-down node N through the second transistor T2 and the third transistor T3. The seventh transistor T7 is turned on under the driving of the pull-down node N, and the second power supply end VGL inputs the second power supply signal to the pull-up node P through the seventh transistor T7, thereby further implementing the resetting of the pull-up node P. In addition, the eighth transistor T8 is turned on under the driving of the pull-up node P, the eleventh transistor T11 is turned on under the control of the clock signal, the first power supply end VGH inputs the first power supply signal to the control node K through the eighth transistor T8 and the eleventh transistor T11 respectively, and the thirteenth transistor T13 is turned on under the driving of the control node K. The second power supply end VGL inputs the second power supply signal to the output end OUT through the thirteenth transistor T13 to implement resetting of the output end OUT. When the first power supply signal is input to the control node K through the eighth transistor T8 and the eleventh transistor T11 respectively, the stability of controlling the potential of the control node K can be improved, thereby further implementing the effective resetting of the output end OUT.

In some embodiments, at least one of the first power supply end and the second power supply end may be a DC power supply end. In addition, the specific potential values of the signals output by the respective power supply ends and signal ends can be adjusted according to actual circuit requirements. For example, the potential of the first power supply signal may be 8V, the potential of the second power supply signal may be −8V, and the high potential of each clock signal may be 8V, which is not limited by the embodiment of the present disclosure.

In the above embodiment, the first transistor T1, the fourth transistor T4, the fifth transistor T5, the seventh transistor T7, the ninth transistor T9, the tenth transistor T10, the thirteenth transistor T13, and the fourteenth transistor T14 are N-type transistors, the second transistor T2, the third transistor T3, the sixth transistor T6, the eighth transistor T8, the eleventh transistor T11, and the twelfth transistor T12 are P-type transistors, and the first potential is a high potential relative to the second potential, which are taken as an example for explanation. Of course, the first transistor T1, the fourth transistor T4, the fifth transistor T5, the seventh transistor T7, the ninth transistor T9, the tenth transistor T10, the thirteenth transistor T13, and the fourteenth transistor T14 may also adopt the P-type transistors. The second transistor T2, the third transistor T3, the sixth transistor T6, the eighth transistor T8, the eleventh transistor T11, and the twelfth transistor T12 may also adopt the N-type transistors, and the first potential may be a low potential relative to the second potential. At this point, the potential change of each signal end can be opposite to the potential change shown in FIG. 8.

In summary, the driving method for a shift register provided by the embodiment of the present disclosure may comprise a charging stage, an output stage, and a reset stage, and the shift register comprises the reset circuit, the latch circuit, the output control circuit and the output circuit, which are series connected in sequence. Besides, by controlling the potential of the pull-up node according to the input signal through the latch circuit, the potential of the pull-up node and the potential of the input signal can be consistent, and thus the shift signal can be statically stored, thereby effectively saving power consumption and improving the anti-interference ability of the signal transmitted in the shift register.

Figure 9:
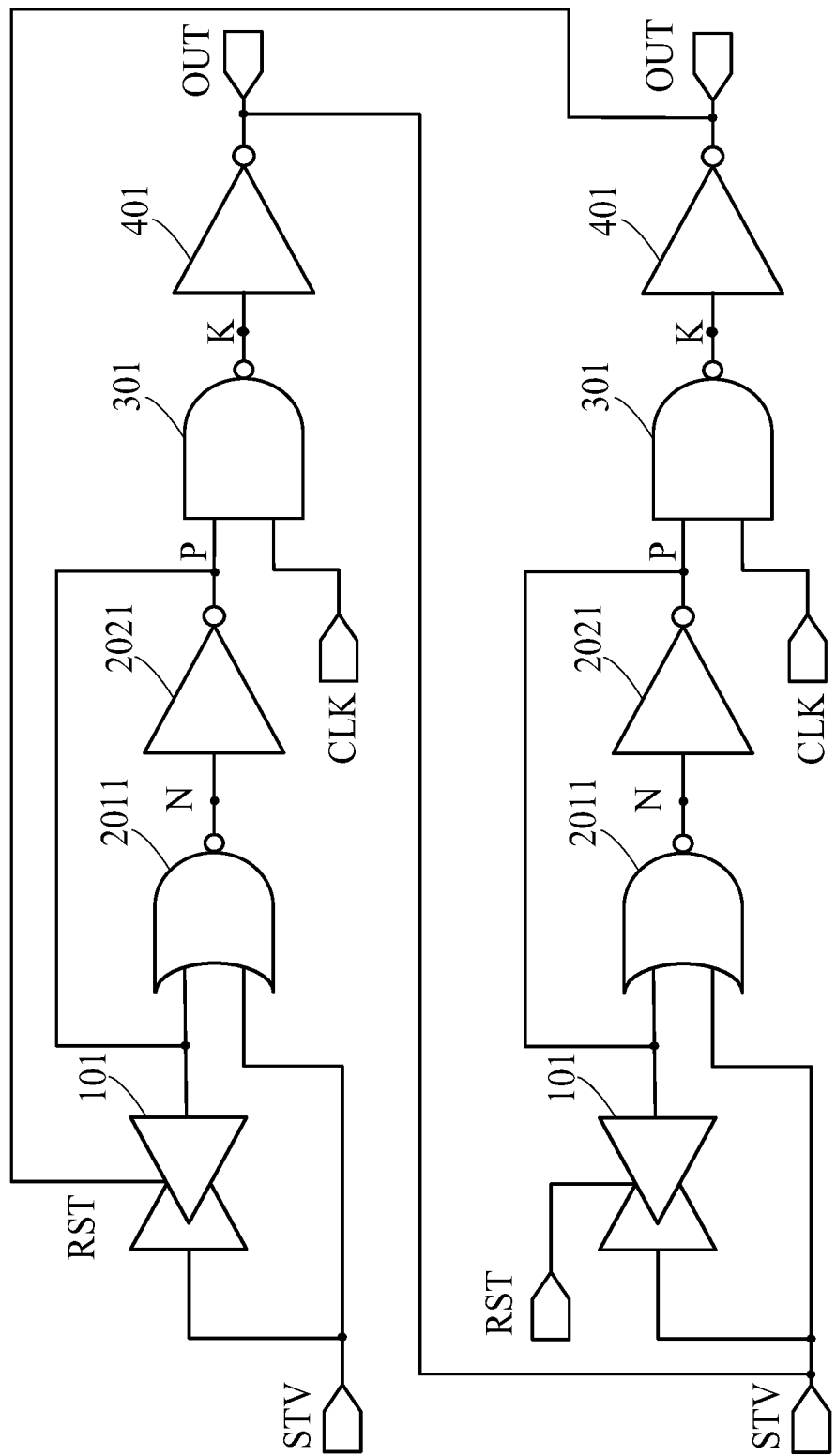
FIG. 9 is a schematic diagram of a structure of a gate driving circuit according to an embodiment of the present disclosure.

An embodiment of the present disclosure provides a gate driving circuit, which may comprise a plurality of cascaded shift registers, and each shift register is the shift register as shown in any of FIGS. 1 to 5. In the plurality of shift registers, the input signal end STV of the shift register in each level may be connected to the output end OUT of the shift register in the upper-level, and the reset signal end RST of the shift register in each level may be connected to the output end OUT of the shift register in the lower-level. Exemplarily, FIG. 9 is a partial schematic structural diagram of a gate driving circuit according to an embodiment of the present disclosure. As shown in FIG. 9, the gate driving circuit comprises two cascaded shift registers, each of which is the shift register as shown in FIG. 3. In the two cascaded shift registers, the input signal end STV of the shift register in second-level may be connected to the output end OUT of the shift register in first-level, and the reset signal end RST of the shift register in first-level may be connected to the output end OUT of the shift register in second-level.

In some embodiments, when the gate driving circuit is manufactured, the transistors (for example, thin film transistors (TFTs)) may be firstly manufactured on a base substrate (for example, a glass substrate) based on a complementary metal oxide semiconductor (CMOS) process, so as to form the P-type and N-type transistors. Various logic circuits are then formed based on the formed transistors, so as to construct the circuits such as the reset circuit 10, the input sub-circuit 201, the latch sub-circuit 202, the output control circuit 30, and the output circuit 40. The circuits are then cascaded to form the gate driving circuit.

Further, when the TFT is manufactured, an active layer in the TFT may be made of a material such as amorphous silicon (a-Si), poly-silicon (p-Si), and an oxide. Since the size of the TFT made of the p-Si is smaller under the premise of reaching the same charge quantity, when the active layer in the TFT is made of the p-Si, not only can the aperture ratio of an effective display area (active area (AA)) be effectively improved, but also the size of the shift register can be reduced. Therefore, the border of the display panel is reduced, and the full-screen display device or the flexible display device without the border can be conveniently realized.

In summary, the plurality of shift registers in the gate driving circuit provided by the embodiment of the present disclosure comprises the reset circuit, the latch circuit, the output control circuit, and the output circuit, which are series connected in sequence. By controlling the potential of the pull-up node according to the input signal through the latch circuit, the potential of the pull-up node and the potential of the input signal can be consistent, and thus the shift signal can be statically stored, thereby effectively saving power consumption and improving the anti-interference ability of the signal transmitted in the shift register.

The embodiments of the present disclosure provide a display device. The display device may include the gate driving circuit shown in FIG. 9. The display device may be: a liquid crystal panel, an electronic paper, an organic light-emitting diode (OLED) panel, a mobile phone, a tablet computer, a TV, a display, a laptop computer, a digital photo frame, a navigator or any other product or part with a display function.

The embodiments of the present disclosure provide a storage medium, including computer programs therein, wherein the computer programs, when executed by a processor, implement the driving method of the shift register in the embodiments of the present disclosure.

The foregoing descriptions are only exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. A shift register, comprising: a reset circuit, a latch circuit, an output control circuit, and an output circuit, wherein
    the reset circuit is respectively connected to an input signal end, a reset signal end and a pull-up node, and is configured to provide an input signal from the input signal end for the pull-up node under the control of a reset signal from the reset signal end;
    the latch circuit is respectively connected to the input signal end and the pull-up node, and is configured to maintain a potential of the pull-up node to he a second potential when the potential of the pull-up node and a potential of the input signal are both the second potential, and control the potential of the pull-up node to be a first potential when the potential of the input signal is the first potential;
    the output control circuit is respectively connected to the pull-up node, a clock signal end, and a control node, and is configured to control a potential of the control node to be the first potential when the potential of the pull-up node is the second potential, and control the potential of the control node to be the second potential when the potential of the pull-up node and the potential of a clock signal from the clock signal end are both the first potential; and
    the output circuit is respectively connected to the control node and an output end, and is configured to control the potential of the output end to be the second potential when the potential of the control node is the first potential, and control the potential of the output end to be the first potential when the potential of the control node is the second potential.

2. The shift register according to 1, wherein the shift register further comprises: a pull-up node control circuit; and
    the pull-up node control circuit is respectively connected to an enable signal end and the pull-up node, and is configured to control the potential of the pull-up node to be the second potential under the control of an enable signal from the enable signal end.

3. The shift register according to 2, wherein the pull--up node control circuit comprises: a fourteenth transistor; and
    a gate electrode of the fourteenth transistor is connected to the enable signal end, a first electrode of the fourteenth transistor is connected to the second power supply end, and a second electrode of the fourteenth transistor is connected to the pull-up node.

4. The shift register according to 1, wherein the reset circuit comprises: a selective inverter; and
    an input end of the selective inverter is connected to the input signal end, a control end of the selective inverter is connected to the reset signal end, and an output end of the selective inverter is connected to the pull-up node.

5. The shift register according to 1, wherein the reset circuit comprises: a first transistor; and
a gate electrode of the first transistor is connected to the reset signal end, a first electrode of the first transistor is connected to the input signal end, and a second electrode of the first transistor is connected to the pull-up node.

6. The shift register according to 1, wherein the latch circuit comprises: an input sub-circuit and a latch sub-circuit;
the input sub-circuit is respectively connected to the input signal end, the pull-up node and a pull-down node, and is configured to control a potential of the pull-down node to the first potential when the potential of the pull-up node and the potential of the input signal are both the second potential, and control the potential of the pull-down node to be the second potential when the input signal is at the first potential; and
the latch sub-circuit is respectively connected to the pull-down node and the pull-up node, and is configured to control the potential of the pull-up node to be the second potential when the potential of the pull-down node is the first potential, and control the potential of the pull-up node to be the first potential when the potential of the pull-down node is the second potential.

7. The shift register according to 6, wherein the input sub-circuit comprises: an NOR gate; and
a first input end of the NOR gate is connected to the pull-up node, a second input end of the NOR gate is connected to the input signal end, and an output end of the NOR gate is connected to the pull-down node.

8. The shift register according to 6, wherein the input sub-circuit comprises: a second transistor, a third transistor, a fourth transistor, and a fifth transistor;
a gate electrode of the second transistor is connected to the pull-up node, a first electrode of the second transistor is connected to a first power supply end, and a second electrode of the second transistor is connected to a first electrode of the third transistor;
a gate electrode of the third transistor is connected to the input signal end, and a second electrode of the third transistor is connected to the pull-down node;
a gate electrode of the fourth transistor is connected to the input signal end, a first electrode of the fourth transistor is connected to a second power supply end, and a second electrode of the fourth transistor is connected to the pull-down node;
a gate electrode of the fifth transistor is connected to the pull-up node, a first electrode of the fifth transistor is connected to the second power supply end, and a second electrode of the fifth transistor is connected to the pull-down node; and
the second transistor has the same polarity as the third transistor, the fourth transistor has the same polarity as the fifth transistor, and the second transistor is opposite in polarity to the fourth transistor.

9. The shift register according to 6, wherein the latch sub-circuit comprises: a first inverter;
an input end of the first inverter is connected to the pull-down node, and an output end of the first inverter is connected to the pull-up node.

10. The shift register according to 6, wherein the latch sub-circuit comprises: a sixth transistor and a seventh transistor;

a gate electrode of the sixth transistor is connected to the pull-down node, a first electrode of the sixth transistor is connected to the first power supply end, and a second electrode of the sixth transistor is connected to the pull-up node;
a gate electrode of the seventh transistor is connected to the pull-down node, a first electrode of the seventh transistor is connected to the second power supply end, and a second electrode of the seventh transistor is connected to the pull-up node; and
the sixth transistor is opposite in polarity to the seventh transistor.

11. The shift register according to 1, wherein the output control circuit comprises: an NAND gate; and
a first input end of the NAND gate is connected to the pull-up node, a second input end of the NAND gate is connected to the clock signal end, and an output end of the NAND gate is connected to the control node.

12. The shift register according to 1, wherein the output control circuit comprises: an eighth transistor, a ninth transistor, and a tenth transistor;
a gate electrode of the eighth transistor is connected to the pull-up node, a first electrode of the eighth transistor is connected to the first power supply end, and a second electrode of the eighth transistor is connected to the control node;
a gate electrode of the ninth transistor is connected to the pull-up node, a first electrode of the ninth transistor is connected to a second electrode of the tenth transistor, and a second electrode of the ninth transistor is connected to the control node;
a gate electrode of the tenth transistor is connected to the clock signal end, and a first electrode of the tenth transistor is connected to the second power supply end; and
the ninth transistor has the same polarity as the tenth transistor, and the eighth transistor is opposite in polarity to the ninth transistor.

13. The shift register according to 12, wherein the output control circuit further comprises: an eleventh transistor;
a gate electrode of the eleventh transistor is connected to the clock signal end, a first electrode of the eleventh transistor is connected to the first power supply end, a second electrode of the eleventh transistor is connected to the control node, and the eleventh transistor has the same polarity as the eighth transistor.

14. The shift register according to 1, wherein the output circuit comprises: a second inverter; and
an input end of the second inverter is connected to the control node, and an output end of the second inverter is connected to the output end.

15. The shift register according to 1, wherein the output circuit comprises: a twelfth transistor and a thirteenth transistor;
a gate electrode of the twelfth transistor is connected to the control node, a first electrode of the twelfth transistor is connected to the first power supply end, and a second electrode of the twelfth transistor is connected to the output end;
a gate electrode of the thirteenth transistor is connected to the control node, a first electrode of the thirteenth transistor is connected to the second power supply end, and a second electrode of the thirteenth transistor is connected to the output end; and
the twelfth transistor is opposite in polarity to the thirteenth transistor.

16. A driving method for a shift register, wherein the shift register comprises: a reset circuit, a latch circuit, an output control circuit, and an output circuit, and the method comprises:

in a charging stage, the input signal output by an input signal end being at a first potential, controlling, by the latch circuit, the potential of a pull-up node to be the first potential under the control of the input signal;

in an output stage, the clock signal output by a clock signal end being at the first potential, maintaining the pull-up node to be at the first potential, controlling, by the output control circuit, the potential of a control node to be a second potential under control of the pull-up node and the clock signal; and controlling, by the output circuit, the potential of an output end to be the first potential under control of the control node; and in a reset stage, the reset signal output by a reset signal end being at the first potential, the input signal being at the second potential, controlling, by the reset circuit, the potential of the pull-up node to be the second potential under control of the reset signal; maintaining, by the latch circuit, the potential of the pull-up node to be the second potential under the control of the pull-up node and the input signal; controlling, by the output control circuit, the potential of the control node to be the first potential under the control of the pull-up node; and controlling, by the output circuit, the potential of the output end to be the second potential under the control of the control node.

17. The method according to 16, wherein the shift register further comprises: a pull-up node control circuit, and the method further comprises:

in a maintaining stage, the enable signal output by an enable signal end being at the first potential, controlling, by the pull-up node control circuit, the potential of the pull-up node to be the second potential under control of the enable signal; controlling, by the output control circuit, the potential of the control node to be the first potential under the control of the pull-up node; and controlling, by the output circuit, the potential of the output end to he the second potential under the control of the control node.

18. The method according to 16, wherein the latch circuit comprises: an input sub-circuit and a latch sub-circuit;

controlling, by the latch circuit, the potential of the pull-up node to he the first potential under control of the input signal comprises:

controlling, by the input sub-circuit, the potential of a pull-down node to be the second potential under the control of the input signal; and controlling, by the latch sub-circuit, the potential of the pull-up node to be the first potential under the control of the pull-down node; and maintaining, by the latch circuit, the potential of the pull-up node to be the second potential under the control of the pull-up node and the input signal comprises:

controlling, by the input sub-circuit, the potential of the pull-down node to be the first potential under the control of the pull-up node and the input signal; and controlling, by the latch sub-circuit, the potential of the pull-up node to be the second potential under the control of the pull-down node.

19. A gate driving circuit, comprising a plurality of cascaded shift registers, the shift register comprising: a reset circuit, a latch circuit, an output control circuit, and an output circuit, wherein the reset circuit is respectively connected to an input signal end, a reset signal end and a pull-up node, and is configured to provide an input signal from the input signal end for the pull-up node under the control of a reset signal from the reset signal end;

the latch circuit is respectively connected to the input signal end and the pull-up node, and is configured to maintain a potential of the pull-up node to be a second potential when the potential of the pull-up node and a potential of the input signal are both the second potential, and control the potential of the pull-up node to be a first potential when the potential of the input signal is the first potential;

the output control circuit is respectively connected to the pull-up node, a clock signal end, and a control node, and is configured to control a potential of the control node to be the first potential when the potential of the pull-up node is the second potential, and control the potential of the control node to be the second potential when the potential of the pull-up node and the potential of a clock signal from the clock signal end are both the first potential; and the output circuit is respectively connected to the control node and an output end, and is configured to control the potential of the output end to be the second potential when the potential of the control node is the first potential, and control the potential of the output end to be the first potential when the potential of the control node is the second potential.

20. A display device, comprising the gate driving circuit according to claim 19.

* * * * *